United States Patent [19]

Nakata et al.

[11] 3,972,113
[45] Aug. 3, 1976

[54] PROCESS OF PRODUCING SEMICONDUCTOR DEVICES

[75] Inventors: Josuke Nakata; Takeshi Yamamoto; Hitoshi Matufuzi, all of Itami, Japan

[73] Assignee: Mitsubishi Denki Kabushiki Kaisha, Tokyo, Japan

[22] Filed: May 6, 1974

[21] Appl. No.: 467,563

[30] Foreign Application Priority Data
May 14, 1973 Japan.............................. 48-53421
Feb. 28, 1974 Japan.............................. 49-24547

[52] U.S. Cl.................................... 29/580; 29/583; 357/56; 357/89
[51] Int. Cl.²............................................ B01J 17/00
[58] Field of Search ............... 29/580, 583; 357/56, 357/89

[56] References Cited
UNITED STATES PATENTS

| | | |
|---|---|---|
| 3,172,785 | 3/1965 | Jochems .............................. 357/56 |
| 3,257,589 | 6/1966 | Belasco ................................ 357/56 |
| 3,535,774 | 10/1970 | Baker .................................. 29/580 |
| 3,608,186 | 9/1971 | Hutson ................................ 29/583 |

*Primary Examiner*—W. Tupman
*Attorney, Agent, or Firm*—Wenderoth, Lind & Ponack

[57] ABSTRACT

Boron is diffused into selected areas of each main face of an N silicon substrate and gallium is diffused into the entire main face to form a P-N junction including deeper portions alternating shallower portion. Selective etching is effected to form grooves in the shallower junction portions for dividing the P-N junction. Both main faces of the substrate except for the grooves are metallized and a passivation layer is applied to each groove. Alternatively, in order to form the P-N junction as above described, gallium is selectively diffused in the substrate followed by a further diffusion of the gallium.

5 Claims, 23 Drawing Figures

PROCESS OF PRODUCING SEMICONDUCTOR DEVICES

BACKGROUND OF THE INVENTION

This invention relates to semiconductor devices and more particularly to improvements in mesa semi-conductor devices and a process of producing the same.

In the early years mesa semiconductor devices were produced by forming the P-N junction in the semiconductor substrate through diffusion, dividing it into a plurality of pellets and etching the lateral surfaces of each pellets to form the mesa regions. In order to eliminate the necessity of separately etching and surface processing the individual pellets, an attempt was made to selectively etch a semiconductor substrate with a P-N junction to form grooves in opposite relationship on the main opposite faces thereof, applying a passivation layer to each groove for protecting the exposed portion of the P-N junction and cutting off the substrate along the grooves. That attempt was advantageous in that the etching and passivation could be effected while the substrate was still in the form of a single wafer but it was disadvantageous in that the substrate included very thin portions sandwiched between pairs of opposite grooves and therefore was relatively apt to be cracked and broken resulting in a poor yield.

Also it was known to offset such grooves on one of the main faces of a substrate from those on the other face thereof. In this measure, the number of pellets into which a single semiconductor substrate could be divided was decreased in order to maintain the same effective area for each pellet. Also it has been difficult to produce semiconductor devices with an ability to withstand high voltage.

In order to improve the process just described, it has been proposed to shallowly diffuse a conductivity type imparting impurity into a semiconductor substrate to form a P-N junction and selectively etch the substrate to form relatively shallow grooves thereon to divide the P-N junction into individual sections. Then the substrate is heated to permit the impurity to be further diffused into the substrate to form one P-N junction between each pair of adjacent grooves. Due to the second diffusion following the selective etching, there has been a danger that any deteriorating element or elements stuck to the substrate in the etching step may be diffused into the latter. In addition, that portion of the P-N junction adjacent to each groove has had a small radius of curvature and therefore tended to restrict the voltage withstood by the resulting device.

SUMMARY OF THE INVENTION

Accordingly, it is an object of the present invention to provide a new and improved process of producing a semiconductor device.

It is another object of the present invention to provide a new and improved process of producing semiconductor devices free from the problems of decreasing the yield due to cracks and break-off of semiconductive wafers involved.

It is still another object of the present invention to provide a new and improved process of producing semiconductor devices having no danger that any deteriorating element or elements may be mingled with a semiconductive wafer involved in the diffusion step.

It is a further object of the present invention to provide a new and improved process of producing a semiconductor device including a P-N junction having a large radius of curvature of its curved portion and consistently produced within tolerance limits.

It is another object of the present invention to provide a new and improved method of making a semiconductor device having an ability to withstand high voltage.

It is a separate object of the present invention to provide a new and improved process of producing semiconductor devices intended for practical use by simplifying the manufacturing steps.

The present invention provides a method of making a semiconductor device including a substrate of semiconductive material having a pair of main opposite faces and at least one P-N junction disposed therein, the P-N junction including a first portion disposed at a predetermined depth in the central portion of the substrate parallel to the adjacent one of the main opposite faces of the substrate, and a second portion disposed in the circumferential portion of the substrate shallower than the first portion, the second portion being non-rectilinearly merged into the first portion, and a groove disposed on the second portion of the P-N junction deeper than the latter.

In order to produce semiconductor devices of the type as described in the preceding paragraph, the present invention also provides a process of producing semiconductor devices, comprising the steps of diffusing a one type-conductivity imparting impurity into a substrate of semiconductive material having the other type-conductivity from a main face thereof so that the impurity is shallowly diffused into the substrate in predetermined selected areas while the impurity is deeply diffused into the substrate in the remaining areas to form therebetween a P-N junction including shallower portions alternating with deeper portions, selectively etching only the selected areas of the substrate to form grooves deeper than the shallower portions of the P-N junction, applying a passivation layer to each of the grooves to protect that portion of the P-N junction exposed to the surface of each groove, and cutting the substrate off along the grooves to divide the latter into a plurality of pellets.

In an alternative process of the present invention the P-N junction as described in the preceding paragraph may be formed by the steps of diffusing a one type-conductivity imparting impurity into a substrate of semiconductive material having the other type conductivity in the entire area of a main face thereof to form a P-N junction therein, removing the diffused semiconductive material from the substrate in selected areas of the main face to leave that material above the associated portions of the P-N junction and further diffusing the impurity into the semiconductive material of the substrate.

BRIEF DESCRIPTION OF THE DRAWINGS

The above and other objects, advantages and features of the present invention will become more readily apparent from the following detailed description taken in conjunction with the accompanying drawings in which.

Throughout the Figures like reference numerals designate the corresponding or similar components.

DESCRIPTION OF THE PREFERRED EMBODIMENTS

Figure 1A:
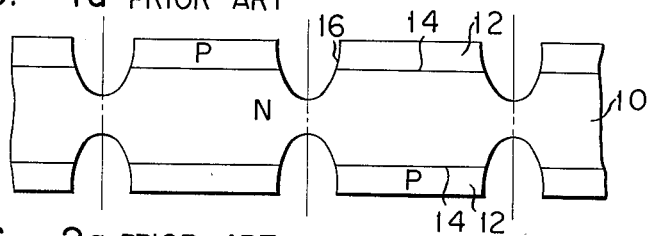
FIGS. 1a and 1b are schematic sectional views of a semiconductor wafer illustrating different steps of a conventional process of producing mesa type semiconductor devices.

Referring now to the drawings, FIG. 1a shows a wafer or a substrate 10 of N type semiconductive material having a pair of P type diffusion layer 12 disposed on the main opposite faces thereof to form respective P-N junctions 14 therebetween. Then a selective etching technique is used to form a plurality of grooves 16 on each of the main wafer faces at substantially equal intervals so as to extend through the adjacent P-N junctions 14 into the N type semi-conductive material with the grooves 16 on each of the main wafer faces directly opposing those on the other main face of the substrate 10. Thereafter the surface of each groove 16 and more particularly that portion of the surface having the P-N junction exposed thereto has applied thereto a suitable passivation layer (not shown). Then the substrate 10 is cut off along the broken line passing through each pair of the opposite grooves 16 as shown in FIG. 1a to divide it into individual pellets as shown in FIG. 1b.

Figure 1B:
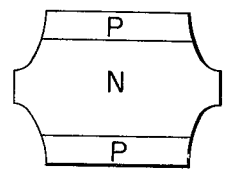

The process as shown in FIGS. 1a and 1b is effective for simplifying the manufacturing steps because the wafer itself can be subject to etching and passivation treatments. However, since the grooves on one of the main wafer face are opposite to those on the other main face to leave very thin portions of the N type substrate layer therebetween, those thin layer portions have been apt to be cracked or broken resulting in a decrease in yield.

Figure 2A:
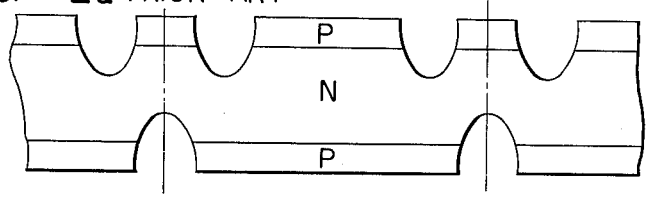
FIGS. 2a and 2b are views similar to FIGS. 1a and 1b respectively but illustrating another conventional process of producing mesa type semiconductor devices.
Figure 2B:
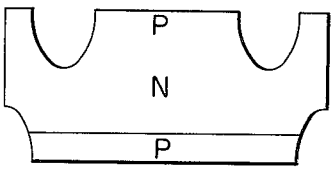

In order to avoid this objection, there has been proposed an attempt to differentiate the arrangement of grooves on one of main faces of semiconductor substrate from those on the other main face thereof so that each groove is disposed on one of main opposite faces of the substrate in a position vertically offset from one pair of adjacent grooves on the other face of the substrate as shown in FIG. 2a. Then the substrate is cut off along broken lines as shown in FIG. 2a to be divided into individual pellets as shown in FIG. 2b. The attempt as above described has been disadvantageous in that with both the length of the substrate and the effective area of the pellet remaining unchanged, the number of the pellets provided by the substrate is decreased and that it is difficult to manufacture semiconductor elements having an ability to withstand high voltage.

Figure 3A:
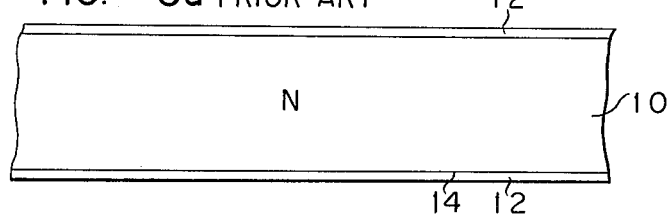
FIGS. 3a through 3d are schematic sectional views of a semiconductor wafer illustrated various manufacturing steps of still another conventional process of producing mesa type semiconductor devices.

To eliminate the disadvantages of the process as shown in FIGS. 2a and 2b, an improved process as shown in FIGS. 3a–3d has been proposed. As shown in FIG. 3a, a substrate 10 of N type semiconductive material such as silicon is first prepared and a P type impurity is shallowly diffused into the substrate 10 from the main opposite faces thereof to form P type layers 12 on both main faces with respective PN junctions 14 formed therebetween.

Figure 3B:
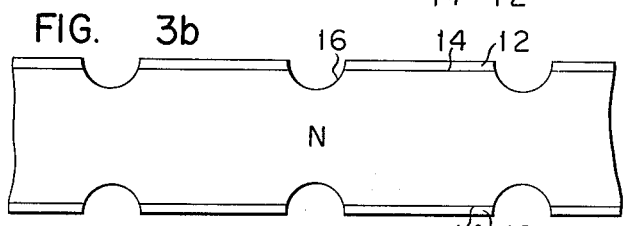

Then selective etching technique is used to form two arrays of relatively shallow grooves longitudinally and transversely extending at substantially equal intervals on each of the main opposite faces of the substrate and directly opposing those on the other main face thereof. Each groove 16 has a depth permitting the adjacent PN junction to be exposed to the surface thereof. Therefore each of the PN junctions 16 is divided into individual sections by the grooves 16. The resulting structure is shown in FIG. 3b.

Figure 3C:
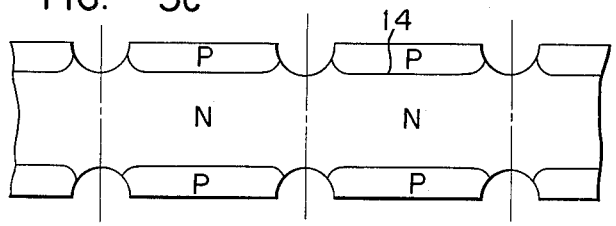

Then the substrate 10 is heated to an elevated temperature to further diffuse the P type impurity into the N type semiconductive material of the substrate 10. In this diffusion operation, that portion of the PN junction 14 adjacent to the groove 16 does not advance into the N type semiconductive material of the substrate 10 so that the junction has a curvature as shown in FIG. 3c.

Figure 3D:
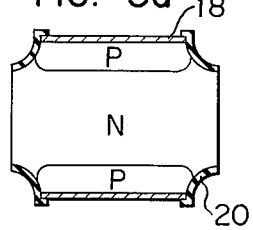

Then a metallized layer 18 is applied to each main face of the substrate 10 except for the grooves 16 after which a passivation layer 20 is applied to each groove 16. Then the substrate is cut off along the grooves 16 as shown at the dotted lines in FIG. 3c to be divided into individual pellets as shown in FIG. 3d.

In the process as above described in conjunction with FIGS. 3a–3d, mesa-etching for forming the mesa region (see FIG. 3b) has been followed by the further diffusion so that there is a danger that any deteriorating element or elements that might be stuck to the substrate during etching may be diffused into the substrate. Also it has been required to again etch that portion of the surface of each groove having the P-N junction exposed thereto. Further the curvature of the P-N junction adjacent to each groove depends upon the cross sectional profile into which each groove has been mesa-etched. According to circumstances, the P-N junction might include a curved portion having a small radius of curvature practically equal to that formed when a planar diffused junction is formed. This has caused difficulties in controlling the resulting devices. For example, the voltage withstood by the device is restricted by the curved portion of the P-N junction involved rather than that portion of the surface of the device to which the P-N junction is exposed. In addition, if a mask used in mesa-etching is formed of a metal, then it is impossible to use as a metallized layer, the intact mask because the mesa-etching is followed by re-diffusion.

The present invention contemplates to eliminate the disadvantages of the prior art practices as above described.

Figure 4A:
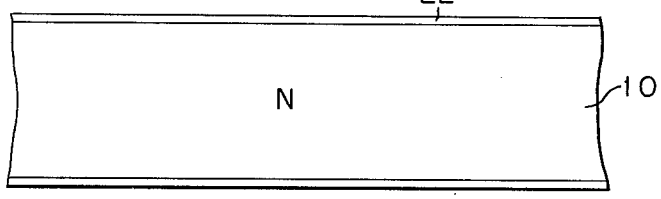
FIGS. 4a through 4h are schematic sectional views of a semiconductor wafer illustrating the succeeding manufacturing steps of a process of producing mesa type semiconductor devices in accordance with the principles of the present invention.
Figure 4B:
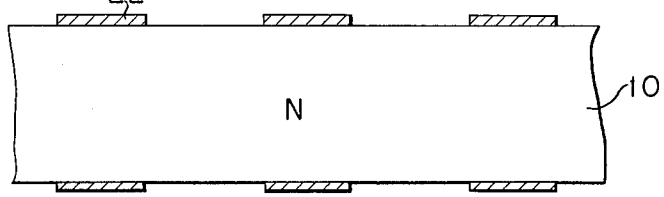

Referring now to FIGS. 4a–4h, there is illustrated a process of producing mesa semiconductor devices in accordance with the principles of the present invention. As shown in FIG. 4a, a substrate 10 of any suitable semiconductive material such as an N type silicon is provided on the main opposite faces with a pair of silicon dioxide films 22 about 1 micron thick through thermal oxidation. Then the silicon dioxide films 22 are selectively removed in the same pattern from the main opposite faces of the substrate 10 in the well known manner. The resulting structure is shown in FIG. 4b.

Figure 4C:
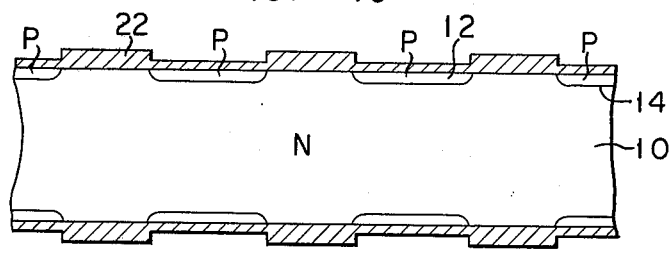

The next succeeding step is to deposit, in the well known manner, a P type impurity in this case boron only upon those portions of each main face of the substrate 10 from which the silicon dioxide film 22 has been removed and locally form thin P type diffusion layers 14 with P-N junctions 14 formed therebetween as shown in FIG. 4c. At the same time, a continuous layer of silicon dioxide is grown on each main face of the substrate 10 including the remaining silicon dioxide film 22. The grown layer is also designated by the reference numeral 22. The resulting structure is shown in FIG. 4c.

Figure 4D:
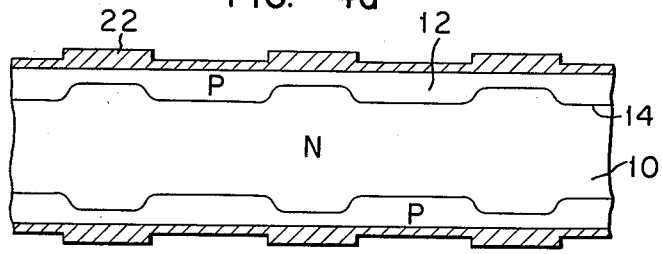

Then another P type impurity in this case, gallium is diffused into the entire area of each main substrate face to a surface concentration than on the order of from $10^{-1}$ to $10^{-2}$ than the concentration of the deposited boron. This results in a structure as shown in FIG. 4d. As shown in FIG. 4d, the P-N junction 14 formed between the P type diffusion layer 12 and the N type silicon of the substrate 10 has those portions of the gallium diffused layer portions (which include no boron previously deposited thereupon) curved to be closer to the surface of the substrate 10. This is because the gallium diffused layer portion is shallower in depth of diffusion than the boron diffused layer portion (which includes also gallium but has a low surface concentration of gallium). Also formed at and adjacent the interface of the boron and gallium diffused layer portions is a non-rectilinear P-N junction having a gentle slope as by the lateral diffusion of the boron. This results in those portions of the P-N junction associated with the deeper diffusion layer portions having radii of curvature greater than the radius of curvature in a planar diffused junction.

Figure 4E:
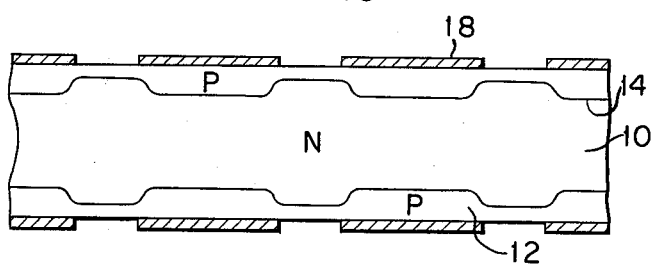

Then the silicon dioxide films 22 are removed from the entire surface of the substrate in the well known manner and a metallized layer is applied to each main face of the substrate 10 by evaporation technique or any other known means. The metallized layer is formed of a metal such as gold or aluminum relatively stable with respect to a nitric-hydrofluoric acid system etching solution commonly used in the succeeding mesa-etching step. This is because the metallized layer is used as a mask in that etching step. For multiple layer structures, such a metal is preferably used to form the uppermost layer. The metallized layer on each main face of the substrate 10 is selectively removed in the manner well known in the art so that the remaining portions 18 of the metallized layer are spaced from one another by gaps having a width slightly less than the width of that portion of the diffusion layer having a smaller in depth of diffusion (which layer of is that portion of the layer diffused gallium alone) or the width of that portion of the main substrate face masked with each silicon dioxide film portion) upon initially depositing the boron on the substrate. Thereafter the substrate 10 thus processed is subject to heat treatment to bring the remaining portions 18 of the metallized layer into ohmic contact with those portions of P type diffusion layer 12 overlaid thereby. The resulting structure is shown in FIG. 4e.

Following this, the substrate 10 is selectively etched with an etching solution including nitric acid and hydrofluoric acid. In this case the metallized layer 24 functions as masks to permit the shallower portions of the diffusion layer 12 to be etched to form grooves 16 defining mesa regions. The proportion of nitric acid to hydrofluoric acid should be changed dependent upon the type of metal forming the metallized layer. The etching rate is suitably of from 5 to 10 microns per minute.

Figure 4F:
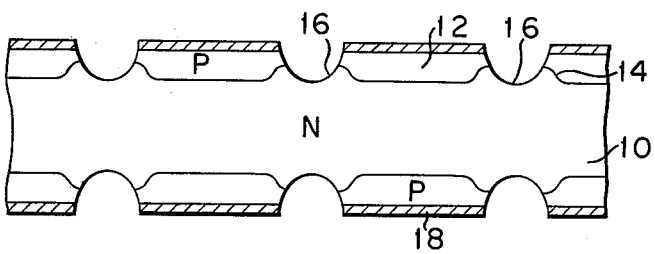

As shown in FIG. 4f, the grooves 16 may be equal in depth to those shown in FIG. 3c. That is, the grooves 16 may be equal in depth to the deeper diffusion layer portions. It is to be noted that, with the grooves formed on both main faces of the substrate 10, the width of the N type layers left between the opposite grooves should not be small enough to cause the mechanical strength of the substrate to come in question.

Figure 4G:
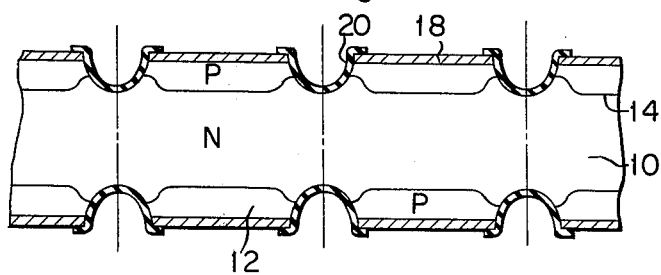

FIG. 4g shows the substrate 10 after a passivation layer 20 has been applied to each of the grooves 16. The passivation can be advantageously effected at a relatively low temperature such as from 500° to 600°C in the presence of the metallized layer 18 on each of the P type diffusion layer portions 14. On the contrary, if a mask used in mesa-etching is of a material other than metals, for example, of a nitride film, then the passivation may be accomplished at a relatively high temperature ranging from 700° to 800°C. This is true in the case where the passivation is effected after the removal of the metallic layer following the mesa-etching. In the latter case, the passivation is followed by the formation of metallized layers.

Figure 4H:
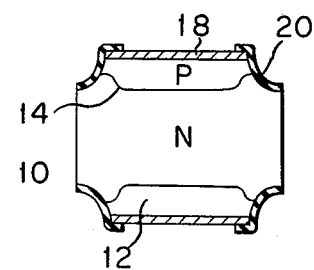

Then the substrate 10 is cut off along the grooves 16 as shown at the broken lines shown in FIG. 4g to be divided into a plurality of individual pellets as illustrated in FIG. 4h.

As shown in FIG. 4h, each pellet or semiconductor device has a pair of PN junctions 14 disposed therein and each including a first portion disposed at a predetermined depth in the central portion thereof parallel to the adjacent one of the main opposite faces of the substrate and a second portion disposed on the circumferential portion of the substrate and shallower than the first portion. The second portion is non-rectilinearly merged into the first portion. Also it will be appreciated that the second portion has a smaller impurity concentration and further has a more gentle gradient of the impurity concentration than the first portion.

The process of the present invention can be modified as shown in FIG. 5. FIG. 5a shows a substrate 10 of any suitable semiconductive material such as N type silicon having one diffusion layer 12 formed by highly diffusing a P type impurity in this case, gallium into each of the main opposite faces of the substrate 10 to a surface concentration of $10^{18}$ atoms per cubic centimeter. The diffusion layer 12 has a depth of about 5 microns and forms a PN junction 14 with the N type silicon. In this diffusion step, a silicon dioxide film 22 is formed on each of the diffusion layers 12.

Figure 5A:
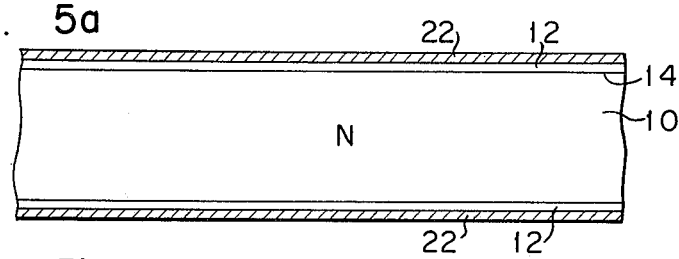
FIGS. 5a through 5g are schematic sectional views of a semiconductor wafer illustrating the succeeding manufacturing steps of a modification of the present invention.
Figure 5B:
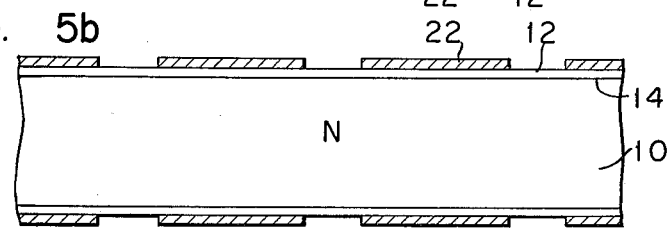
Figure 5C:
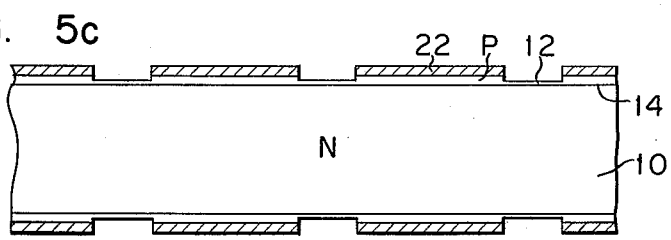

As above described in conjunction with FIG. 4b, the silicon dioxide films 22 are selectively removed in the same pattern from both main faces of the substrate 10 in the manner well known in the art. The resulting structure is shown in FIG. 5b. Then the main faces of the substrate 10 are slightly etched to a depth less than the depth of the diffusion layer 12 with the remaining portion of the diffusion layer 12 used as a mask for this etching. Thus the gallium diffused portion is left above the PN junction 14. In this case the substrate is preferably etched to from 3 to 3.5 microns. In order to precisely control the etching depth, an etching solution used which preferably has a slow etching rate. For example, the etching rate is suitably about 5 microns per minute. As a result of the etching, the etched surface of the gallium layer 22 has an impurity concentration as low as $10^{-1}$ or $10^{-2}$ as compared with the other portions thereof. FIG. 5c shows the substrate 10 after having been thus etched.

Figure 5D:
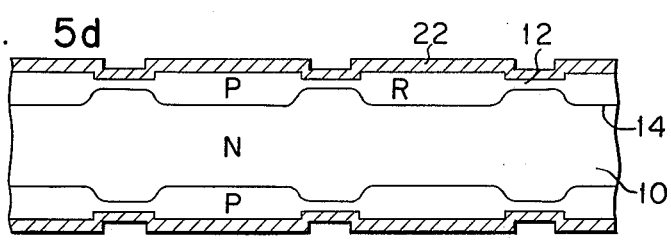

Then the substrate 10 is heated to permit the gallium from the layer 12 to be further diffused into the semiconductive material of the substrate 10. The resulting structure is shown in FIG. 5d. In FIG. 5d a P-N junction 14 formed through the additional diffusion of the gallium has those portions larger in depth than the remaining portions. Thus the P-N junction is similar to that shown in FIG. 4d. This is because the etched portions of the gallium layer 12 have less gallium surface concentration and therefore a slower diffusion speed than the remaining portions thereof. Thus the depth of the PN junction formed after the completion of the diffusion is shallower at the etched portions of the gallium layer than at the other portions thereof. Also as the gallium is laterally diffused from the higher concentration portion to the lower concentration portion, the diffusion speed is progressively varied. As a result, the graded P-N junction repeatedly varied between two different depths has curved portions with a large radius of curvature as shown in FIG. 5d. This ensures that no early breakdown occurs at those curved portions.

Figure 5E:
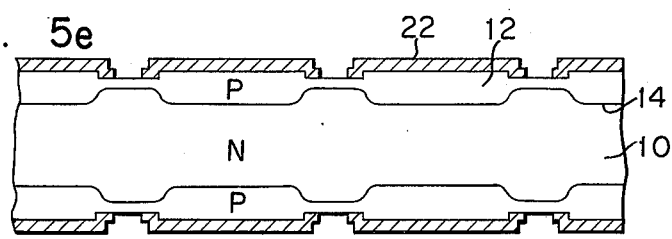

After the completion of the diffusion as above described, those portions of the silicon dioxide layer 22 underlaid by the shallower portions of the P-N junction, or the shallowly etched portions of the gallium layer 12 are selectively removed in the manner well known in the art as shown in FIG. 5e.

Figure 5F:
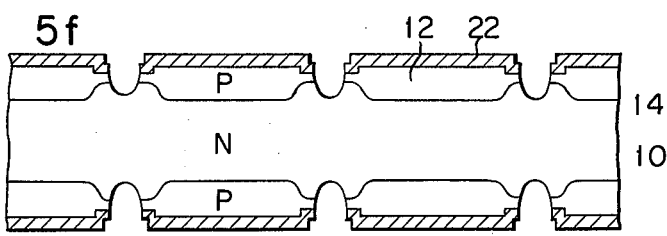

Following this, those exposed portions of the layer 12 are etched whereby grooves 16 are formed having a depth larger than the associated depth of the P-N junction to divide the P-N junction into individual sections. The width of each groove is preferably smaller than that of each shallow depth portion of the PN junction. The resulting structure is shown in FIG. 5f. An etching solution used in the step as shown in FIG. 5f may have a higher etching rate than that used in the step as shown in FIG. 5c.

Figure 5G:
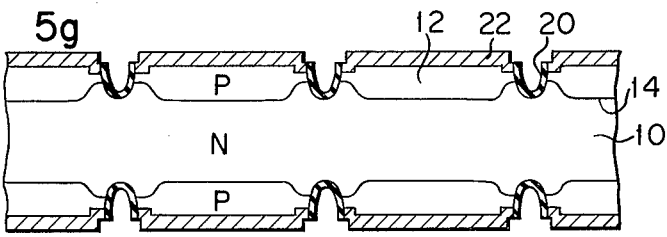

Then the step of FIG. 4g is repeated to apply a passivation layer 20 made for example, of boro-silicate glass to each of the grooves 16 as shown in FIG. 5g after which the substrate 10 is divided into individual pellets as above described in conjunction with FIG. 4h.

While the process as shown in FIG. 5 has been described in conjunction with the etching mask formed of the silicon dioxide film, it is to be understood that it is not restricted thereto thereby and that the mask may be formed not only of an electrically insulating film such as a silicon nitride film but also of a metal for example gold or aluminum with satisfactory results.

The present invention has several advantages. For example, the grooves for dividing the PN junction into individual sections can be shallow and therefore the grooves can be arranged in directly opposite relationship on the main opposite faces of the substrate without rendering the remaining portions of the substrate excessively thin. Thus the substrate with the grooves has less chance of cracking and breaking. The end of the P-N junction exposed to the etched surface of each groove has a lower impurity concentration than the intermediate portion thereof. This is attended with both a gentle gradient of impurity concentration and the facilitation of the production of semiconductor elements with the ability to withstand a high voltage. At the same time, the value of withstood voltage is restricted by portions of the P-N junction because those portions have a large radius of curvature. Further the process of manufacturing semi-conductor elements can be simplified because the metallized layer is used as the mask for etching for forming mesa regions as well as producing consistently semiconductor element within tolerance limits.

While the present invention has been illustrated and described in conjunction with a few preferred embodiments thereof it is to be understood that various changes and modifications may be resorted to without departing from the spirit and scope of the present invention. For example, an N-type emitter layer may be formed on one of main opposite faces of a substrate alone to produce a thyristor. Also the present invention is equally applicable to the production of mesa semiconductor devices other than those described herein.

We claim:

1. A process of producing semiconductor devices comprising the steps of diffusing a one type-conductivity imparting material into the entire area of a main face of a substrate of semiconductive material having the other type conductivity to form a P-N junction therein, partly removing the diffused semiconductive material from said substrate in selected areas of said main face to leave that material above said P-N junction, further diffusing said impurity into said semiconductive material of said substrate to modify said PN junction so that the PN junction is shallow in depth in said selected area while it is deeper in the remaining areas, etching said selected areas of said main substrate face to form grooves deeper than the associated portion of said modified P-N junction, applying a passivation layer to each of said grooves to protect that portion of said modified P-N junction exposed to the surface of each groove, and cutting said substrate along said grooves to divide it into a plurality of pellets.

2. A process of producing semiconductor devices comprising the steps of selectively diffusing a one type-conductivity imparting impurity into a substrate of semi-conductive material having an opposite type conductivity from at least one of the main faces thereof for forming a continuous PN junction having a surface parallel to said one main face, removing a portion of the thickness of the layer formed by the diffused impurity in the material of the substrate at predetermined selected areas, providing a mask at the remaining areas, further diffusing the impurity into the substrate to provide a continuous PN junction having a surface which is at a shallow depth with respect to said one main face in the predetermined selected areas of said substrate and at a deep depth with respect to said one main face in the remaining areas thereof, selectively etching only said predetermined selected areas of said one main face of said substrate to form grooves deeper than the depth of said portions of the PN junction disposed in said predetermined selected areas and having a smaller dimension in the direction of the PN junction surface than the length of the PN junction in the shallow depth areas, applying a passivation layer to each of said grooves to protect that portion of said PN junction exposed to the surface of each groove, and cutting said substrate off along said grooves to divide it into a plurality of pellets.

3. A process as claimed in claim 2 in which the one type-conductivity imparting impurity is diffused into the substrate from both main faces of the substrate with the predetermined selected areas opposed to each other on the opposite main faces of the substrate, and the step of selective etching is carried out on the selected areas of both main faces of the substrate.

4. A process of producing semiconductor devices comprising the steps of shallowly diffusing a one type-conductivity imparting impurity into predetermined selected areas of at least one main face of a substrate of semiconductive material having an opposite type conductivity, diffusing another impurity imparting the one type-conductivity into the entire area of said one main face of said substrate with a concentration less than that of the first impurity for forming a continuous PN junction having first portions of the surface thereof parallel to said main face of said substrate and at a deep depth with respect to said one main face only in said predetermined selected areas of said substrate and having second portions parallel to said main face and at a shallow depth with respect to said one main face in the remaining areas thereof, applying a metallic layer to each of said predetermined selected areas of said substrate, etching said one main face of said substrate by using said metallic layers as masks thereby to form grooves deeper than the portions of said PN junction disposed in said remaining areas, and having a smaller dimension in the direction of the PN junction surface than the length of the PN junction in the shallow depth areas, applying a passivation layer to each of said grooves to protect that portion of said PN junction exposed to the surface of each groove, and cutting said substrate off along said grooves to divide it into a plurality of pellets.

5. A process as claimed in claim 4 in which the one type-conductivity imparting impurities are diffused into the substrate from both main faces of the substrate with the predetermined selected areas opposed to each other, and the step of selective etching is carried out on the remaining areas of both main faces of the substrate.

* * * * *